(12) United States Patent
Tsai et al.

(10) Patent No.: US 6,709,894 B2
(45) Date of Patent: Mar. 23, 2004

(54) SEMICONDUCTOR PACKAGE AND METHOD FOR FABRICATING THE SAME

(75) Inventors: Chung-Che Tsai, Hsinchu (TW); Wei-Heng Shan, Hsinchu (TW); Huan-Ping Su, Hsinchu (TW)

(73) Assignee: UltraTera Corporation (TW)

( * ) Notice: Subject to any disclaimer, the term of this patent is extended or adjusted under 35 U.S.C. 154(b) by 0 days.

(21) Appl. No.: 10/170,665

(22) Filed: Jun. 12, 2002

(65) Prior Publication Data

US 2003/0153123 A1 Aug. 14, 2003

(51) Int. Cl.$^7$ ............... H01L 21/44; H01L 21/48; H01L 21/50
(52) U.S. Cl. ............ 438/113; 438/118; 438/126; 257/777
(58) Field of Search ............... 438/106, 113, 438/118

(56) References Cited

U.S. PATENT DOCUMENTS 6,316,289 B1 * 11/2001 Chung ............... 438/118
6,352,879 B1 * 3/2002 Fukui et al. ............ 438/106
6,620,649 B2 * 9/2003 Uchida ............... 438/107

* cited by examiner

*Primary Examiner*—John Niebling
*Assistant Examiner*—Angel Roman
(74) *Attorney, Agent, or Firm*—Peter F. Corless; Steven M. Jensen; Edwards & Angell, LLP

(57) ABSTRACT

A semiconductor package and a fabrication method thereof are provided. A plurality of first chips are mounted on and electrically connected to a substrate plate. A shielding structure including a shielding portion and a supporting portion is mounted on the substrate plate, wherein the supporting portion abuts against the substrate plate, and the shielding portion is formed with a plurality of openings corresponding in position to the first chips. An adhesive is applied through the openings to form adhesive layers respectively on the first chips. After removing the shielding structure from the substrate plate, a plurality of second chips are respectively stacked on the adhesive layers and electrically connected to the substrate plate. By performing molding and singulating processes, the packaged structure is singulated to form individual semiconductor packages. It is a characteristic advantage of forming the adhesive layers in a batch manner, making fabrication costs and time significantly reduced.

12 Claims, 5 Drawing Sheets

SEMICONDUCTOR PACKAGE AND METHOD FOR FABRICATING THE SAME

FIELD OF THE INVENTION

The present invention relates to semiconductor packages and fabrication methods of the same, and more particularly, to a stack semiconductor package, and a method for fabricating the stack semiconductor package in a batch manner.

BACKGROUND OF THE INVENTION

For improving performances and functionality of electronic products, a semiconductor package is preferably highly integrated with more electronic components being incorporated on a fixed-sized chip. However, forming of a highly integrated chip requires considerably advanced fabrication technology, which thereby sets limitation to process availability and application for producing highly integrated chips. Therefore, an alternative way is to develop a multi-chip semiconductor package.

A multi-chip semiconductor package e.g. a stack package is characterized by stacking at least two chips on a chip carrier such as substrate or lead frame. The stack semiconductor package can be fabricated by process steps illustrated in FIGS. 4A to 4C. Referring to FIG. 4A, the first step is to mount a plurality of first chips 22 on a chip carrier 20, and to form a plurality of bonding wires 23 for electrically connecting the first chips 22 respectively to the chip carrier 20. Then, referring to FIG. 4B, an adhesive 212 such as silver paste or epoxy resin is applied on the first chips 22, for allowing a plurality of second chips 25 to be respectively stacked on the first chips 22, with the adhesive 212 being interposed between the first and second chips 22, 25; this forms a duel-chip stack structure. Finally, referring to FIG. 4C, a plurality of second bonding wires 26 are formed to electrically connect the second chips 25 respectively to the chip carrier 20; then, molding, ball-implanting and singulating processes are performed to form a plurality of individual semiconductor packages 2.

In the above package fabrication method, for stacking the second chips 25 on the first chips 22, a conventional dispensing process is performed to apply the adhesive 212 on the first chips 22; the dispensing process can be implemented by stamping or globing technique in a manner that, a syringe 27 filled with the adhesive 212 is moved to and fro along the chip carrier 20; when the syringe 27 moves to a pre-determined position right above a first chip 22, the adhesive 212 is released and applied on the first chip 22. However, such a one-by-one adhesive-applying method is considerably time-consuming, and not suitably used for batch package production. Moreover, adhesive-dispensing equipment is usually expensive, making fabrication costs undesirably increased. Furthermore, due to amount variations of the adhesive 212 being applied on different first chips 22, it is therefore difficult to maintain uniform qualities of fabricated products.

SUMMARY OF THE INVENTION

An objective of the present invention is to provide a semiconductor package and a method for fabricating the same, whereby adhesive layers respectively applied on chips are simultaneously formed in a batch manner, without having to use expensive adhesive-dispensing equipment, thereby making fabrication costs and time both significantly reduced.

Another objective of the invention is to provide a semiconductor package and a method for fabricating the same, allowing adhesive layers to be uniformly applied on chips respectively, thereby improving quality of fabricated package products.

In accordance with the above and other objectives, a method for fabricating a semiconductor package proposed in the invention, comprises the steps of: preparing a substrate plate having a plurality of arrayed substrates; mounting at least one first chip on each of the substrates of the substrate plate, wherein the first chip has an active surface and an inactive surface opposed to the active surface, allowing the inactive surface to be attached to the substrate; forming a plurality of first bonding wires for electrically connecting the active surfaces of the first chips respectively to the substrates; mounting on the substrate plate a shielding structure having a supporting portion adapted to abut against the substrate plate without affecting arrangement of the first chips and the first bonding wires, and a shielding portion attached to the supporting portion for being elevated by the supporting portion to a predetermined height that prevents the shielding portion from interfering with the first bonding wires, wherein the supporting portion is formed with a plurality of arrayed receiving holes for receiving the first chips and the first bonding wires, and the shielding portion is formed with a plurality of openings each connecting a corresponding one of the receiving holes, and wherein the shielding structure is dimensioned sufficiently in surface area to cover the first chips, and each of the openings of the shielding portion is smaller in dimension than each of the receiving holes of the supporting portion; applying an adhesive onto the active surface of each of the first chips via the openings of the shielding portion of the shielding structure in a batch manner, so as to form an adhesive layer on the active surface of each of the first chips; removing the shielding structure from the substrate plate, and stacking at least one second chip on the adhesive layer; electrically connecting the second chips to the substrate plate by wire bonding with a plurality of second bonding wires; and performing molding, ball-implanting and singulating processes to form a plurality of individual semiconductor packages.

The above fabrication method is characterized by using a shielding structure as a barrier for adhesive application. The shielding structure is composed of a shielding portion and a supporting portion, wherein the shielding portion is supported above a substrate plate by the supporting portion, and formed with a plurality of openings respectively corresponding in position to first chips mounted on the substrate plate. This allows an adhesive to be applied through the openings of the shielding portion and form adhesive layers respectively on active surfaces of the first chips. These adhesive layers can be desirably made with uniform thickness, allowing overall structure to be evenly dimensioned in height with second chips being stacked on the first chips by the adhesive layers, thereby improving quality of fabricated package products. And, forming of the adhesive layers is implemented in a batch manner by e.g. printing technique, thereby making fabrication costs and time effectively reduced, without having to use expensive adhesive-dispensing equipment and conventional dispensing technique for applying an adhesive on underlying chips one by one.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1A:
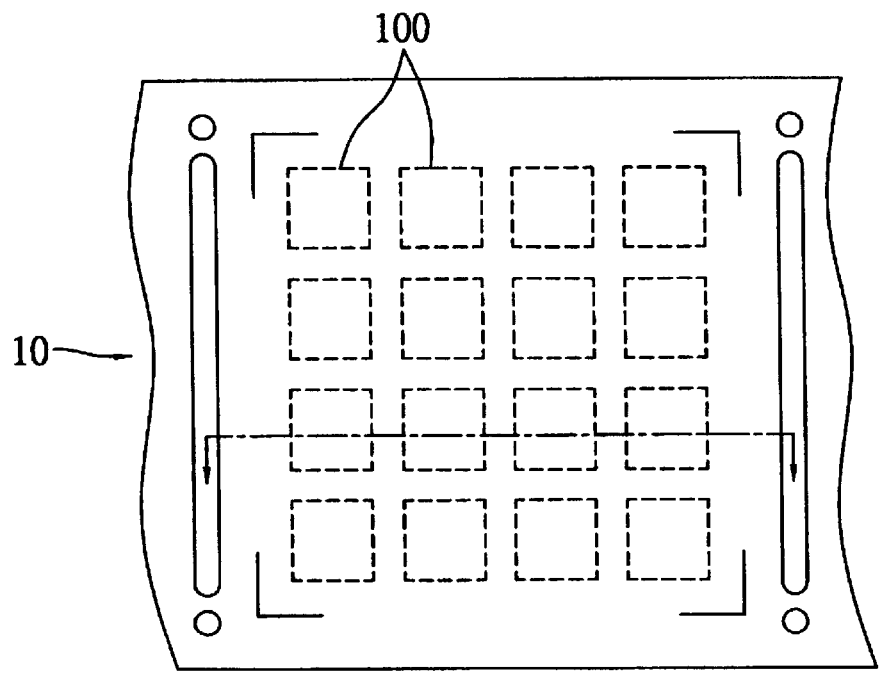
FIGS. 1A–1F are schematic diagrams showing process steps for fabricating a semiconductor package according to an embodiment of the invention.

FIGS. 1A to 1F illustrate process steps of a method for fabricating a semiconductor package according to an embodiment of the present invention. Referring to FIG. 1A, the first step is to prepare a BGA (ball grid array) substrate plate 10 having a plurality of arrayed substrates 100; for example, the substrate plate 10 comprises sixteen substrates 100 arranged in 4×4 array.

Figure 1B:
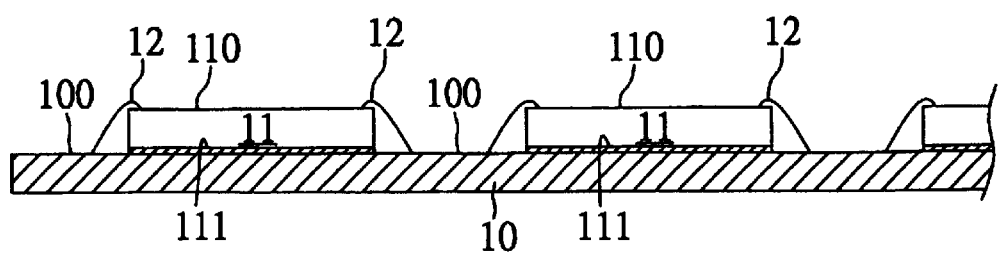

Referring to FIG. 1B, the next step is to mount a first chip 11 on each of the substrates 100, wherein the first chip 11 has an active surface 110 where a plurality of electronic circuits and components are mounted, and an inactive surface 111 opposed to the active surface 110. After completing the chip-bonding process, a plurality of first bonding wires 12 such as gold wires are formed for electrically connecting the first chips 11 respectively to the substrates 100. Since the wire-bonding process is conventional in the art, it is not to be further described herein. Alternatively, reverse bonding technology can also be adopted in this embodiment, by which the first bonding wires 12 are adapted to extend from the substrates 100 to the first chips 11, so as to control loop height of the first bonding wires 12 in a manner as not to interfere with a subsequent adhesive-applying process.

Figure 1C:
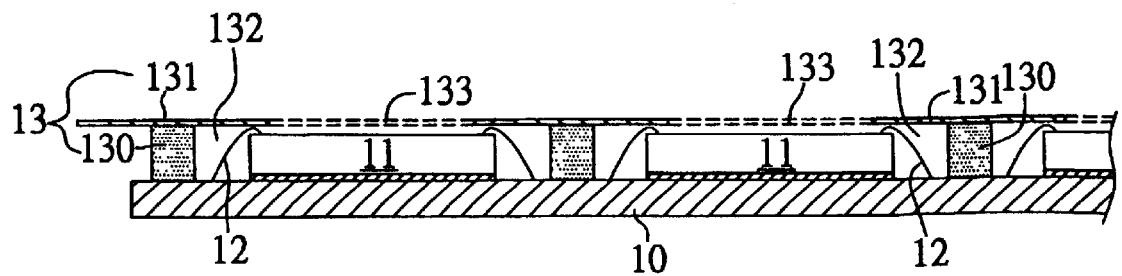

Referring further to FIG. 1C, a shielding structure 13 is prepared and dimensioned sufficiently in surface area to cover all the first chips 11 mounted on the substrate plate 10. The shielding structure 13 comprises a supporting portion 130 and a shielding portion 131; in accompany with reference to FIGS. 2A–2C, the supporting portion 130 is adapted to abut against the substrate plate 10 without affecting arrangement of the first chips 11 and the first bonding wires 12 in a manner that, the supporting portion 130 is formed with a plurality of arrayed receiving holes 132 for receiving the first chips 11 and the first bonding wires 12. The shielding portion 131 is attached to the supporting portion 130, and elevated by the supporting portion 130 to a predetermined height that prevents the shielding portion 131 from interfering with the first bonding wires 12. The shielding portion 131 is formed with a plurality of openings 133 corresponding in position to the first chips 11 respectively, each of which openings 133 connects a corresponding one of the receiving holes 132 of the supporting portion 130, wherein the opening 133 is smaller in dimension than the corresponding receiving hole 132.

Figure 2A:
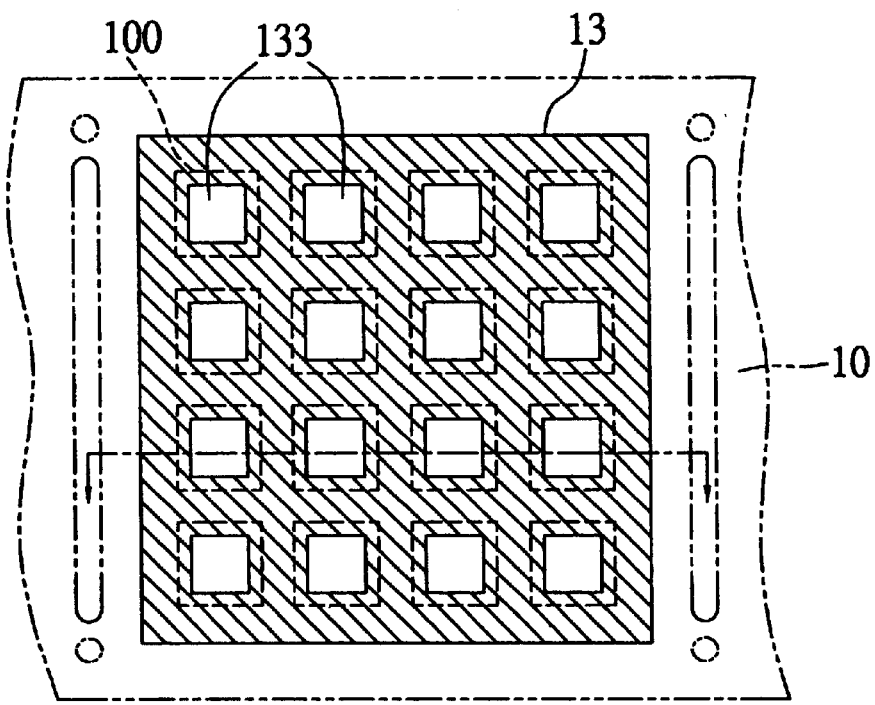
FIG. 2A is a top view of a shielding structure mounted on a substrate plate according to an embodiment of the invention.
Figure 2B:
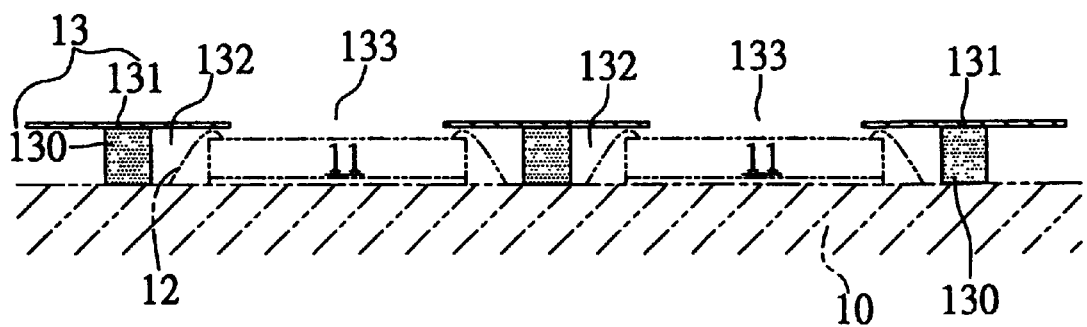
FIGS. 2B and 2C are cross-sectional views of the shielding structure shown in FIG. 2A.
Figure 2C:
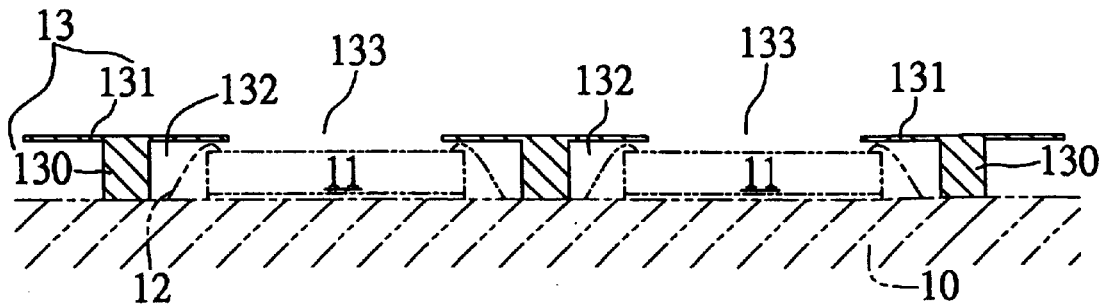
Figure 3A:
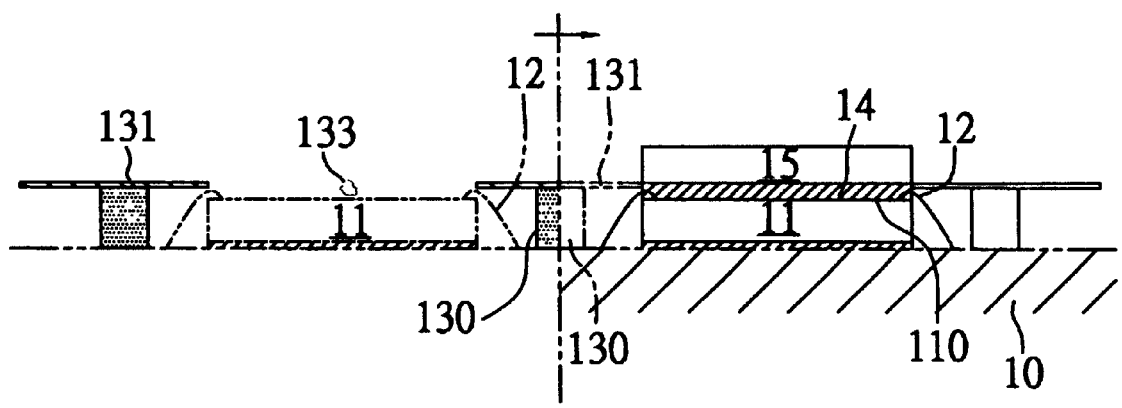
FIGS. 3A and 3B are cross-sectional views of a semiconductor package according to another embodiment of the invention.

Further referring to FIGS. 2A–2C, the supporting portion 130 of the shielding structure 13 can be a frame structure integrally (FIG. 2C) or separately (FIG. 2B) formed with the shielding portion 131 of a plate shape; as shown in FIG. 2B, the supporting portion 130 can be separately fabricated by e.g. FR4 resin to be attached with the shielding portion 131 made of a plastic film or organic material; as shown in FIG. 2C, the supporting portion 130 downwardly extend from the shielding portion 131 to form an insulating shielding structure 13. The openings 133 of the shielding portion 131 are each dimensioned in response to size of a second chip (not shown) to be subsequently stacked on each of the first chips 11. When the second chip is smaller in size than the first chip 11 so as not to interfere with bonding between the first chip 11 and the first bonding wires 12, the opening 133 may be dimensioned equally to the second chip. If the second chip is sized equally to or larger than the first chip 11, the opening 133 is preferably dimensioned approximately the same as the first chip 11, as shown in FIG. 3A (left part).

Figure 1D:
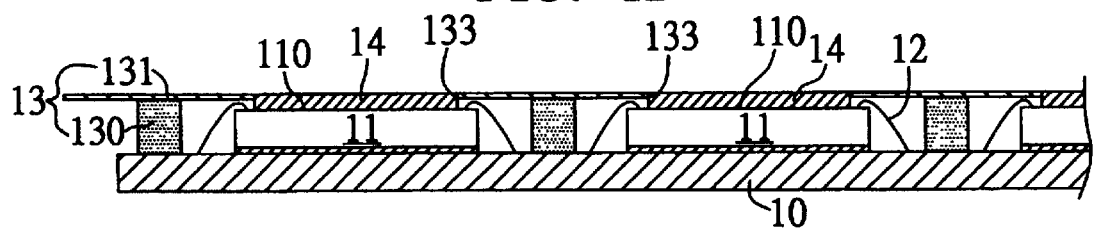

Referring to FIG. 1D, an adhesive such as silver paste, epoxy resin or polyimide, is applied by printing technique in a match manner onto the active surface 110 of each of the first chips 11 through the openings 133 of the shielding portion 131 of the shielding structure 13, so as to form an adhesive layer 14 on each of the first chips 11. Since the printing technique is conventional in the art, it is not to be further described herein. The adhesive layer 14 is dimensioned according to size of the opening 133; for example, as shown in FIG. 1D, with the opening 133 being smaller in size than the first chip 11, the adhesive layer 14 only covers part of the active surface 110 of the first chip 11 without affecting arrangement of the first bonding wires 12; alternatively, as shown in FIG. 3A (right part), with the opening 133 being approximately equal in size to the first chip 11, the adhesive layer 14 would cover entirely the active surface 110 of the first chip 11 and encapsulate partly the first bonding wires 12. Moreover, batch forming of the adhesive layers 14 is beneficial of reducing fabrication costs and time, as compared to the prior art of using dispensing technique to apply an adhesive on chips one by one.

Figure 1E:
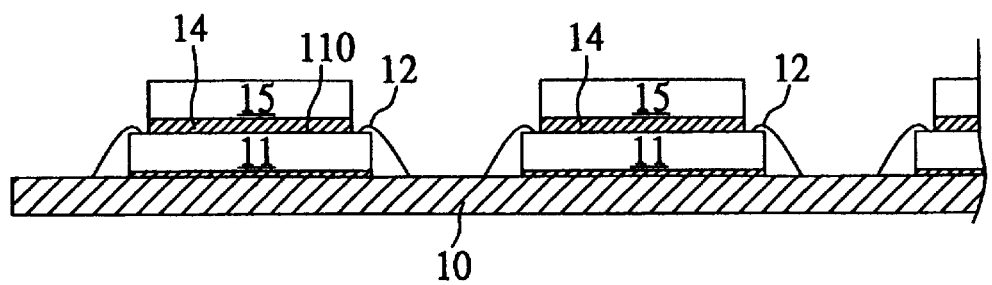
Figure 1F:
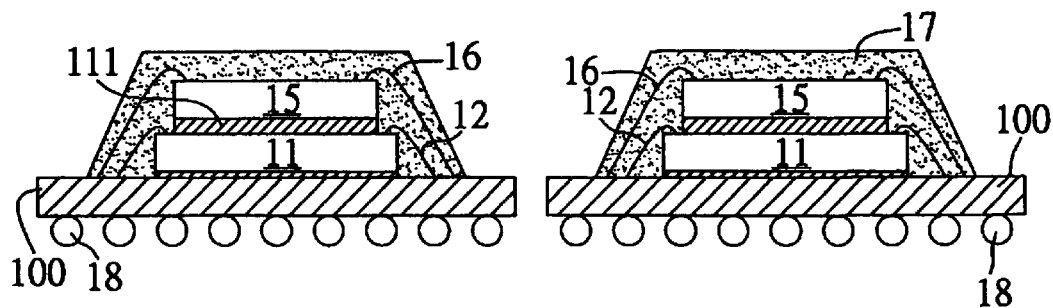

Referring to FIGS. 1E and 1F, after completing the adhesive-applying process, the shielding structure 13 including the supporting portion 130 and the shielding portion 131, is removed from the substrate plate 10. Then, a plurality of second chips 15 are stacked respectively on the adhesive layers 14 formed over the first chips 11. As shown in FIG. 1E, with the adhesive layer 14 covering partly the first chip 11 without affecting arrangement of the first bonding wires 12, the second chips 15 mounted on the first chips 11 are each smaller in size than a corresponding one of the first chips 11; alternatively, as shown in FIG. 3A (right part), with the adhesive layer 14 covering entirely the active surface 110 of the first chip 11, the second chips 15 can be sized equally to or larger than the corresponding first chips 11.

Figure 3B:
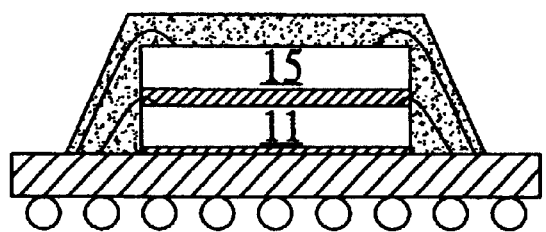
Figure 4A:
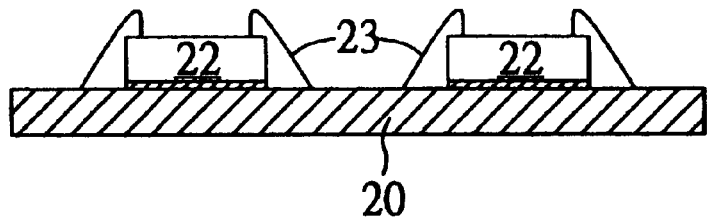
FIGS. 4A–4C (PRIOR ART) are schematic diagrams showing process steps for fabricating a conventional semiconductor package.
Figure 4B:
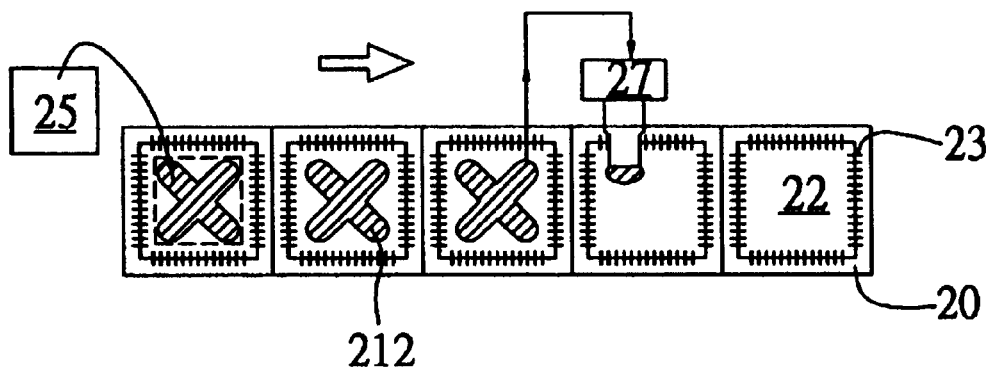
Figure 4C:
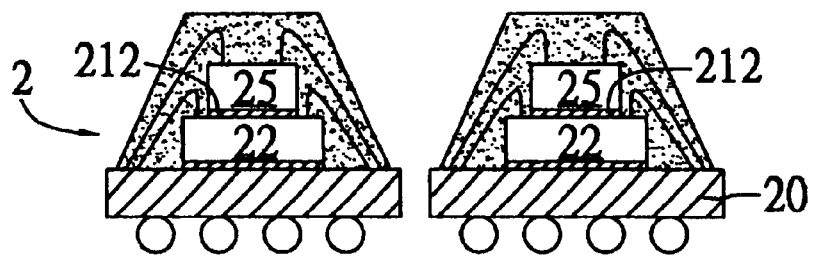

By performing curing and wire-bonding processes, the second chips 15 can be firmly disposed above the first chips 11, and electrically connected to the substrates 100 respectively by a plurality of second bonding wires 16. After that, a molding process is carried out to form an encapsulant 17 that completely encapsulates the first and second chips 11, 15 and the first and second bonding wires 12, 16. Finally, the substrate plate 10 with the packaged structure is implanted with a plurality of solder balls 18, and singulated to separate apart the substrates 100, so as to form a plurality of individual stack semiconductor packages; in this embodiment, with the substrate plate 10 being composed of sixteen substrates 100, sixteen semiconductor packages would be fabricated. And, fabricated semiconductor packages allow flexible size arrangement of the first and second chips 11, 15 accommodated therein; for example, the second chips 15 can be sized smaller than (FIG. 1F) or equally to (FIG. 3B) the first chips 11 respectively.

The above fabrication method is characterized by using a shielding structure as a barrier for adhesive application. The shielding structure is composed of a shielding portion and a supporting portion, wherein the shielding portion is supported above a substrate plate by the supporting portion, and formed with a plurality of openings respectively corresponding in position to first chips mounted on the substrate plate. This allows an adhesive to be applied through the openings of the shielding portion and form adhesive layers respectively on active surfaces of the first chips. These adhesive layers can be desirably made with uniform thickness, allowing overall structure to be evenly dimensioned in height with second chips being stacked on the first chips by the adhesive layers, thereby improving quality of fabricated package products. And, forming of the adhesive layers is implemented in a batch manner by e.g. printing technique, thereby making fabrication costs and time effectively reduced, without having to use expensive adhesive-dispensing equipment and conventional dispensing technique for applying an adhesive on underlying chips one by one.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a semiconductor package, comprising the steps of:

preparing a substrate plate having a plurality of arrayed substrates;

mounting at least one first chip on each of the substrates of the substrate plate, wherein the first chip has an active surface and an inactive surface opposed to the active surface, allowing the inactive surface to be attached to the substrate;

forming a plurality of first bonding wires for electrically connecting the active surfaces of the first chips respectively to the substrates;

mounting on the substrate plate a shielding structure having a supporting portion adapted to abut against the substrate plate without affecting arrangement of the first chips and the first bonding wires, and a shielding portion attached to the supporting portion for being elevated by the supporting portion to a predetermined height that prevents the shielding portion from interfering with the first bonding wires, wherein the supporting portion is formed with a plurality of arrayed receiving holes for receiving the first chips and the first bonding wires, and the shielding portion is formed with a plurality of openings each connecting a corresponding one of the receiving holes, and wherein the shielding structure is dimensioned sufficiently in surface area to cover the first chips, and each of the openings of the shielding portion is smaller in dimension than each of the receiving holes of the supporting portion;

applying an adhesive onto the active surface of each of the first chips via the openings of the shielding portion of the shielding structure in a batch manner, so as to form an adhesive layer on the active surface of each of the first chips;

removing the shielding structure from the substrate plate, and stacking at least one second chip on the adhesive layer;

electrically connecting the second chips to the substrate plate by wire bonding with a plurality of second bonding wires; and performing molding and singulating processes to form a plurality of individual semiconductor packages.

2. The method of claim 1, further comprising a step of performing a ball-implanting process prior to the singulating process.

3. The method of claim 1, wherein the semiconductor package is a stack package.

4. The method of claim 1, wherein the supporting portion is an insulating frame structure made of FR-4 resin.

5. The method of claim 1, wherein the shielding portion is in a plate shape.

6. The method of claim 1, wherein the supporting portion is integrally formed with the shielding portion.

7. The method of claim 1, wherein the supporting portion is separately formed with the shielding portion.

8. The method of claim 1, wherein the adhesive is an insulating material selected from the group consisting of silver paste, polyimide and epoxy resin.

9. The method of claim 1, wherein the second chip is smaller in size than the first chip so as not to interfere with bonding between the first chip and the first bonding wires, and each of the openings of the shielding portion may be dimensioned equally to the second chip.

10. The method of claim 9, wherein the adhesive layer is applied to the active surface of each of the first chips, without being in contact with the first bonding wires.

11. The method of claim 1, wherein the second chip is sized at least equally to the first chip, and each of the openings of the shielding portion is dimensioned equally to each of the first chips.

12. The method of claim 11, wherein the adhesive layer is capable of entirely covering the active surface of the first chip, so as to encapsulate a portion of the first bonding wires interposed between the first and second chips.

* * * * *